United States Patent
Takiguchi

(12) 
(10) Patent No.: US 6,218,865 B1
(45) Date of Patent: Apr. 17, 2001

(54) SEMICONDUCTOR DEVICE HAVING FUNCTION BLOCKS WITH OBLIQUELY ARRANGED SIGNAL TERMINALS CONNECTED THROUGH TWO-DIMENSIONALLY EXTENSIBLE SIGNAL LINES

(75) Inventor: Michie Takiguchi, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/114,941

(22) Filed: Jul. 14, 1998

(30) Foreign Application Priority Data

Jul. 16, 1997 (JP) .................................................... 9-191541

(51) Int. Cl.⁷ ............................ H01L 25/00; H03K 19/00
(52) U.S. Cl. .......................................................... 326/101
(58) Field of Search ..................................... 257/776, 774, 257/773, 211, 206, 623; 174/260, 261; 361/783; 326/101, 41, 47, 39, 102, 103

(56) References Cited

U.S. PATENT DOCUMENTS

| | | | | |
|---|---|---|---|---|
| 4,197,555 | * | 4/1980 | Uehara et al. | 357/70 |
| 4,947,229 | * | 8/1990 | Tanaka et al. | 357/45 |
| 4,974,049 | * | 11/1990 | Sueda et al. | 357/45 |
| 5,095,325 | * | 3/1992 | Noda et al. | 357/45 |
| 5,355,004 | * | 10/1994 | Saitoh | 257/211 |
| 5,444,275 | * | 8/1995 | Kugishima et al. | 257/206 |
| 5,488,238 | * | 1/1996 | Enraku et al. | 257/207 |
| 5,663,677 | * | 9/1997 | Freyman et al. | 327/565 |
| 5,682,107 | * | 10/1997 | Tavana et al. | 326/41 |
| 5,894,142 | * | 4/1999 | Fiduccia et al. | 257/207 |
| 5,923,059 | * | 7/1999 | Gheewala | 257/204 |
| 5,994,726 | * | 11/1999 | Ikeda et al. | 257/207 |

FOREIGN PATENT DOCUMENTS 62-120042  6/1987  (JP) .
 64-7650  1/1989  (JP) .

* cited by examiner

Primary Examiner—Jeffrey Gaffin
Assistant Examiner—Jeremy Norris
(74) Attorney, Agent, or Firm—Foley & Lardner

(57) ABSTRACT

A multi-layered wiring structure electrically connects signal terminals of a function block to signal terminals of another function block, and the signal terminals are obliquely arranged with respect to a side line and an end line defining an area occupied by the function block so that vertical interconnections connect the signal terminals to first-level conductive lines and second-level conductive lines without interference, thereby reducing the vertical interconnections and, accordingly, area between the function blocks.

11 Claims, 9 Drawing Sheets

SEMICONDUCTOR DEVICE HAVING FUNCTION BLOCKS WITH OBLIQUELY ARRANGED SIGNAL TERMINALS CONNECTED THROUGH TWO-DIMENSIONALLY EXTENSIBLE SIGNAL LINES

FIELD OF THE INVENTION

This invention relates to a semiconductor device and, more particularly, to a semiconductor device having two-dimensionally extensible signal lines for selectively connecting function blocks.

DESCRIPTION OF THE RELATED ART

A semiconductor integrated circuit device has plural function blocks, and logic cells are incorporated in each function blocks. Although the logic cells have been already connected through signal lines in the function blocks, there is not any signal line between the logic cells of one function block and the logic cells of another function block. This means that a designer is expected to individually determine signal paths between the function blocks.

Japanese Patent Publication of Unexamined Application No. 62-120042 discloses an automatic wiring system for electrical connections between the function blocks, and FIG. 1 illustrates an example disclosed in the Japanese Patent Publication of Unexamined Application. Reference numerals 1, 2, 3 and 4 respectively designate function blocks, and the function blocks 1 to 4 are integrated on a semiconductor substrate. The function blocks 1 to 4 have signal terminals 1a to 1d, 2a/2b, 3a/3b and 4a/4b, respectively, and the signal terminals 1a to 1d, 2a/2b, 3a/3b and 4a/4b are selectively connected through a multi-layered wring structure 5.

The multi-layered wiring structure 5 includes first-level conductive lines 5a, 5b, 5c, 5d, 5e, 5f and 5g, second-level conductive lines 5h, 5j, 5k, 5m, 5n, 5o, 5p and 5r and vertical interconnections 6a, 6b, 6c, 6d, 6e, 6f, 6g, 6h, 6j, 6k and 6m. The first-level conductive lines 5a to 5g extend in perpendicular to the second-level conductive lines 5h to 5r, and an inter-level insulating layer (not shown) is inserted between the first-level conductive lines 5a to 5g and the second-level conductive lines 5h to 5r. Thus, the first-level conductive lines 5a to 5g and the second-level conductive lines 5h to 5r are different in height from the semiconductor substrate. Contact holes are formed in the inter-level insulating layer, and are plugged with the vertical interconnections 6a to 6m, respectively.

The signal terminals 1a, 1b and 2a are connected to the first-level conductive lines 5a/5c/5b, respectively, and the second-level conductive lines 5h/5j are connected through the vertical interconnections 6a/6d and 6c to the first-level conductive lines 5a/5b and 5c.

On the other hand, the signal terminals 1d/1c, 2b, 3a/3b and 4a/4b are connected to the second-level conductive lines 5q/5o, 5m, 5k/5n and 5p/5r, respectively, and the first-level conductive lines 5g/5f/5e and 5d are connected to the second-level conductive lines 5q/5r, 5o/5p, 5m/5n and 5j/5k through the vertical interconnections 6k/6m, 6j/6h, 6f/6g and 6d/6e, respectively. The first-level conductive line 5d is bent so as to align one end with the vertical interconnection 6d.

The signal terminals 1a/1b and 2a are arranged on the side lines of the function blocks ½ extending in parallel to the second-level conductive lines 5h to 5r, and the other signal terminals 1c/1d, 2b, 3a/3b and 4a/4b are arranged on the end lines of the function blocks 1 to 4 extending in parallel to the first-level conductive lines 5a to 5g. The conductive lines 5a to 5r are selectively formed on the first-level and the second-level depending upon the extending direction, and the vertical interconnections 6a to 6m complete the electrical paths between the signal terminals 1a to 4b.

When signal terminals are arranged on the end lines of function blocks, the multi-layered wiring structure connects the signal terminals as shown in FIG. 2. Three function blocks 11, 12 and 13 are integrated on a semiconductor substrate. Signal terminals 11a/11b/11c/11d, 12a/12b/12c/12d and 13a/13b/13c/13d are arranged along the end lines of the function blocks 11/12/13, respectively, and a multi-layered wiring structure 14 selectively connects the signal terminals 11a to 11d, to the signal terminals 12a to 12d, 13a to 13d and signal terminals of another function block (not shown). The multilayered wiring structure includes first-level conductive lines 15a/15b/15c/15d, second-level conductive lines 16a/16b/16c/16d, 17a/17b/17c/17d and 18a/18b/18c/18d and vertical interconnections 19a/19b/19c/19d, 20a/20b/20c/20d and 21a/21b/21c/21d.

The second-level conductive lines 16a/16b/16c/16d directly connect the signal terminal 11a/11b/11c/11d to the signal terminals 13a/13b/13c/13d, and are connected through the vertical interconnections 19a/19b/19c/19d to the first-level conductive lines 15a/15b/15c/15d. The first-level conductive lines 15a/15b/15c/15d are connected through the vertical interconnections 20a/20b/20c/20d and the second-level conductive lines 18a/18b/18c/18d to the signal terminals of another function block (not shown), and through the vertical interconnections 21a/21b/21c/21d to the second-level conductive lines 17a/17b/17c/17d. The signal terminals 12a/12b/12c/12d are respectively connected to the second-level conductive lines 17a/17b/17c/17d. Thus, the function block II supplies electric signals through the multi-layered wiring structure 14 to the function blocks 12/13/ . . . In this instance, the signal terminals 11a to 11d, 12a to 12d and 13a to 13d are arranged only on the end lines of the function blocks 11/12/13, and the second-level conductive lines 16a to 16d and 17a to 17d are connected to the signal terminals 11a to 11d, 12a to 12d and 13a to 13d.

On the other hand, when signal terminals are arranged on the side lines of function blocks, the multi-layered wiring structure connects the signal terminals as shown in FIG. 3. Function blocks 31/32 are integrated on a semiconductor substrate, and signal terminals 31a/31b/31c/31d and 2a/32b/32c/32d are arranged on side lines of the function blocks 31/32. A multilayered wiring structure 33 connects the signal terminals 31a to 31d to the signal terminals 32a to 32d and signal terminals of another function block (not shown).

The multi-layered wiring structure 33 includes first-level conductive lines 34a/34b/34c/34d, second-level conductive lines 35a/35b/35c/35d and vertical interconnections 36a/36b/36c/36d. The first-level conductive lines 34a to 34d are connected at the left ends to the signal terminals 31a to 31d and at the right ends to the signal terminals 32a to 32d, respectively, and are connected through the vertical interconnections 36a to 36d to the second-level conductive lines 35a to 35d. The second-level conductive lines 35a to 35d propagate electric signals to the signal terminals of another function block (not shown).

In this instance, the second-level conductive lines 35a to 35d are 0.5 micron wide, and are spaced from one another by the minimum gap G1 of 1 micron. The through-holes for the vertical interconnections 36a and 36d are spaced from the signal terminals 31a and 32d by at least 1 micron. Each of the signal terminals 31a to 31d and 32a to 32d occupies square area of 0.5 micron by 0.5 micron. As a result, it is necessary to space the function block 31 from the other function block 32 by at least 8 microns.

However, if signal terminals 31e/31f/31g/31h and 32e/32f/32g/32h are added to the function blocks 31/32, respectively, first-level conductive lines 34e/34f/34g/34h, second-level conductive lines 35e/35f/35g/35h and vertical interconnections 36e/36f/36g/36h are further incorporated in the multilayered wiring structure 33. The signal terminals 31e to 31h/32e to 32h, the second-level conductive lines 35e to 35h and the contact holes for the vertical interconnections 36e to 36h are equal in dimensions to the signal terminals 31a to 31d/32a to 32d, the second-level conductive lines 35a to 35d and the contact holes for the vertical interconnections 36a to 36d, respectively. It is necessary to space the function block 31 from the other function block 32 by at least 14 microns. Thus, the gap G2 is increased together with the signal terminals arranged on the side lines of the function blocks 31/32.

The prior art multi-layered wiring structure encounters a problem in that the multi-layered wiring structure requires wide area between the function blocks. When the signal terminals are increased, the problem becomes serious as understood from comparison between FIGS. 3 and 4.

SUMMARY OF THE INVENTION

It is therefore an important object of the present invention to provide a semiconductor device, a wiring structure of which is simple and requires occupation area narrower than that of the prior art wiring structure.

The present inventor contemplated the problem inherent in the prior art multi-layered wiring structure, and noticed that the location of signal terminals set a limit on the extending direction of conductive lines connected thereto. For example, the signal terminals 1a/1b/1c and 31a to 31d were only connected to the conductive lines extending in parallel to the end lines of the function blocks, and the signal terminals 1c/1d, 2b, 3a/3b, 4a/4b, 11a–11d, 12a–12d and 13a–13d were only connected to the conductive lines extending in parallel to the side lines of the function blocks. When a designer changed the direction of a signal path, the designer added a conductive line perpendicular to the conductive line directly connected to the signal terminal, and the above described limitation increased the conductive lines and, accordingly, the area occupied by the signal path. The present inventor concluded that the removals of the restrictions would achieve a wiring structure occupying narrower area.

To accomplish the object, the present invention proposes to obliquely arrange signal terminals so as to allow the signal terminals to be connected to conductive lines extending on different levels.

In accordance with one aspect of the present invention, there is provided a semiconductor device comprising at least one function block producing electric signals and including a plurality of signal terminals having first signal terminals arranged along a first virtual line obliquely extending with respect to second virtual lines perpendicular to each other and used for electrically communication with another function block and a wiring structure connected to the first signal terminals for propagating the electric signals between the aforesaid at least one function block and the another function block and including first conductive lines arranged on a first level and obliquely extending with respect to the first virtual line, second conductive lines arranged on a second level different from the first level and obliquely extending with respect to both of the first virtual line and the first conductive lines and first interconnections selectively connecting the first signal terminals to the first and second conductive lines.

BRIEF DESCRIPTION OF THE DRAWINGS

The features and advantages of the semiconductor device will be more clearly understood from the following description taken in conjunction with the accompanying drawings in which.

DESCRIPTION OF THE PREFERRED EMBODIMENTS

First Embodiment

Figure 5:
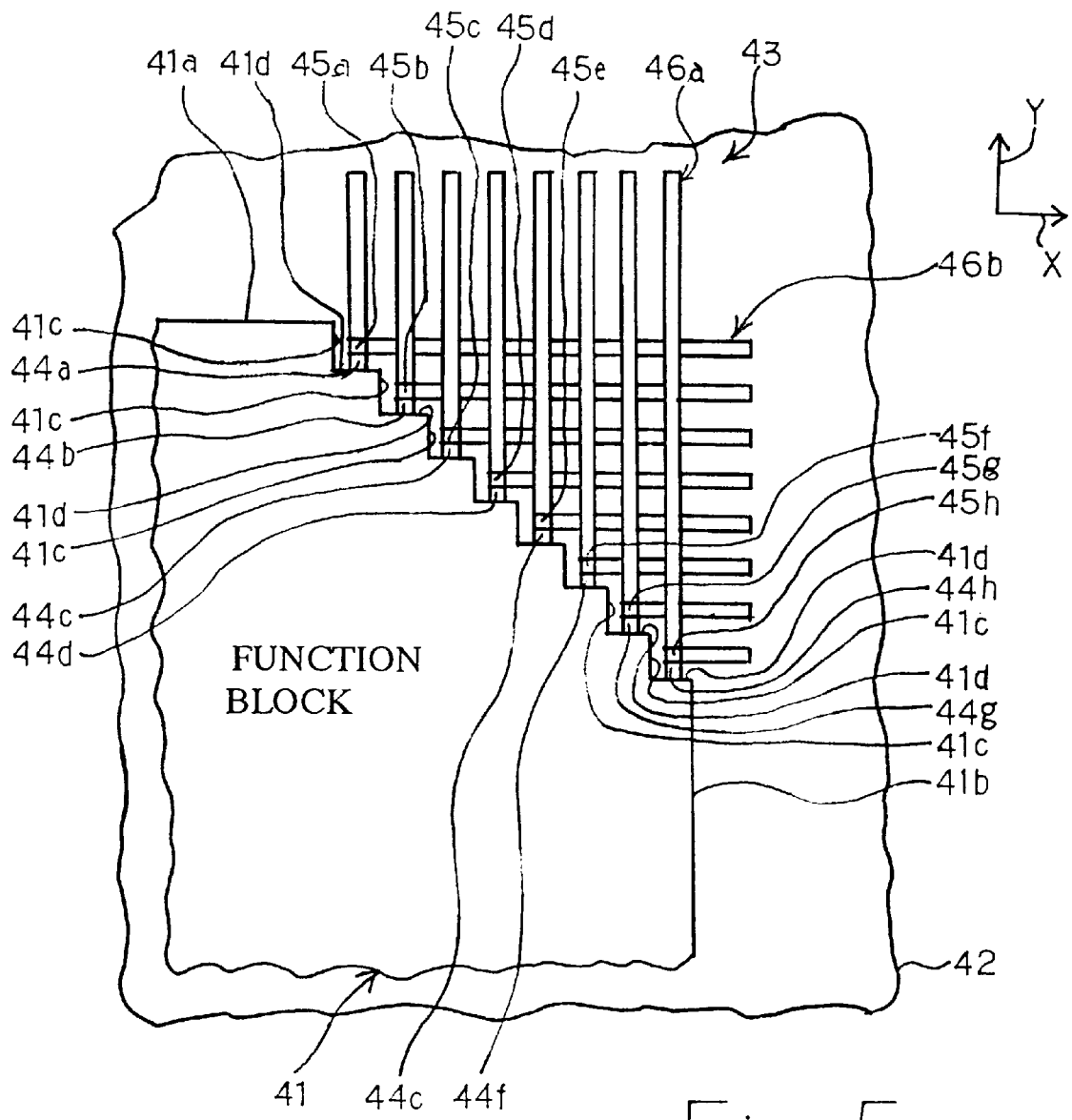
FIG. 5 is a plane view showing a semiconductor integrated circuit device according to the present invention.

Referring to FIG. 5 of the drawings, a function block 41 is integrated on a semiconductor substrate 42 together with a wiring structure 43. Though not shown in FIG. 5, plural logic cells form the function block 41, and the function block 41 achieves a predetermined task through a logical sequence of the logic cells. The function block 41 occupies a generally rectangular area having a pair of end lines 41a and a pair of side lines 41b perpendicular to the end line 41a. However, only a quarter of the function block 41 is shown in FIG. 5, and one of the end lines 41a and one of the side lines 41b partially define the quarter of the function block 41. The end line 41a extends in x-direction, and the side line 41b extends in y-direction.

The end line 41a is connected through a zigzag line to the side line 41b, and a zigzag line obliquely extends in the orthogonal coordinate x-y. First sub-lines 41c are spaced from one another in the x-direction, and second sub-lines 41d are spaced from one another in the y-direction. The first sub-lines 41c are alternately connected to the second sub-lines 41d so as to form the zigzag line, which obliquely extends between the end line 41a and the side line 41b.

The function block 41 further includes signal terminals 44a, 44b, 44c, 44d, 44e, 44f, 44g and 44h, and the logic cells are selectively connected to the signal terminals 44a to 44h so as to communicate with another function block (not shown) through the wiring structure 43.

The wiring structure 43 includes vertical interconnections 45a, 45b, 45c, 45d, 45e, 45f, 45g and 45h, first-level conductive lines 46a, second-level conductive lines 46b and a multi-layered inter-level insulating structure. The first-level conductive lines 46a extend in the y-direction, and the second-level conductive lines 46b extend in the x-direction. Though not shown in FIG. 5, a first inter-level insulating layer and a second inter-level insulating layer are formed over the semiconductor substrate 42, and the first inter-level insulating layer and the second inter-level insulating layer are inserted between the signal terminals 44a to 44h and the first-level conductive lines 46a and between the first-level conductive lines 46a and the second-level conductive lines 46b. In other words, the first-level conductive lines 46a extend on the first inter-level insulating layer, and the second-level conductive lines 46b extend on the second inter-level insulating layer. The first inter-level insulating layer and the second inter-level insulating layer form a multi-layered inter-level insulating structure.

Through-holes are formed in the multi-layered inter-level insulating structure, and the signal terminals 44a to 44h are respectively exposed to the through-holes. Each of the through-holes penetrates only the first inter-level insulating layer or both of the first inter-level insulating layer and the second inter-level insulating layer, and the vertical interconnections 45a to 45h respectively fill the through-holes. For this reason, each of the vertical interconnections 45a to 45h connects the associated signal terminal to the firstlevel conductive line 46a and/or the second-level conductive line 46b. Thus, the signal terminals 44a to 44h are selectively connected to the first-level conductive lines 46a and the second-level conductive lines 46b through the vertical interconnections 45a to 45h. As a result, electric signals are propagated from the signal terminals 44a to 44h in the y-direction and/or the x-direction, and the vertical interconnections 45a to 45h are reduced rather than the prior art wiring structure. The reduction of vertical interconnections makes the area occupied by the wiring structure narrower, and the wiring structure according to the present invention is simpler than the prior art wiring structure.

Second Embodiment

Figure 6:
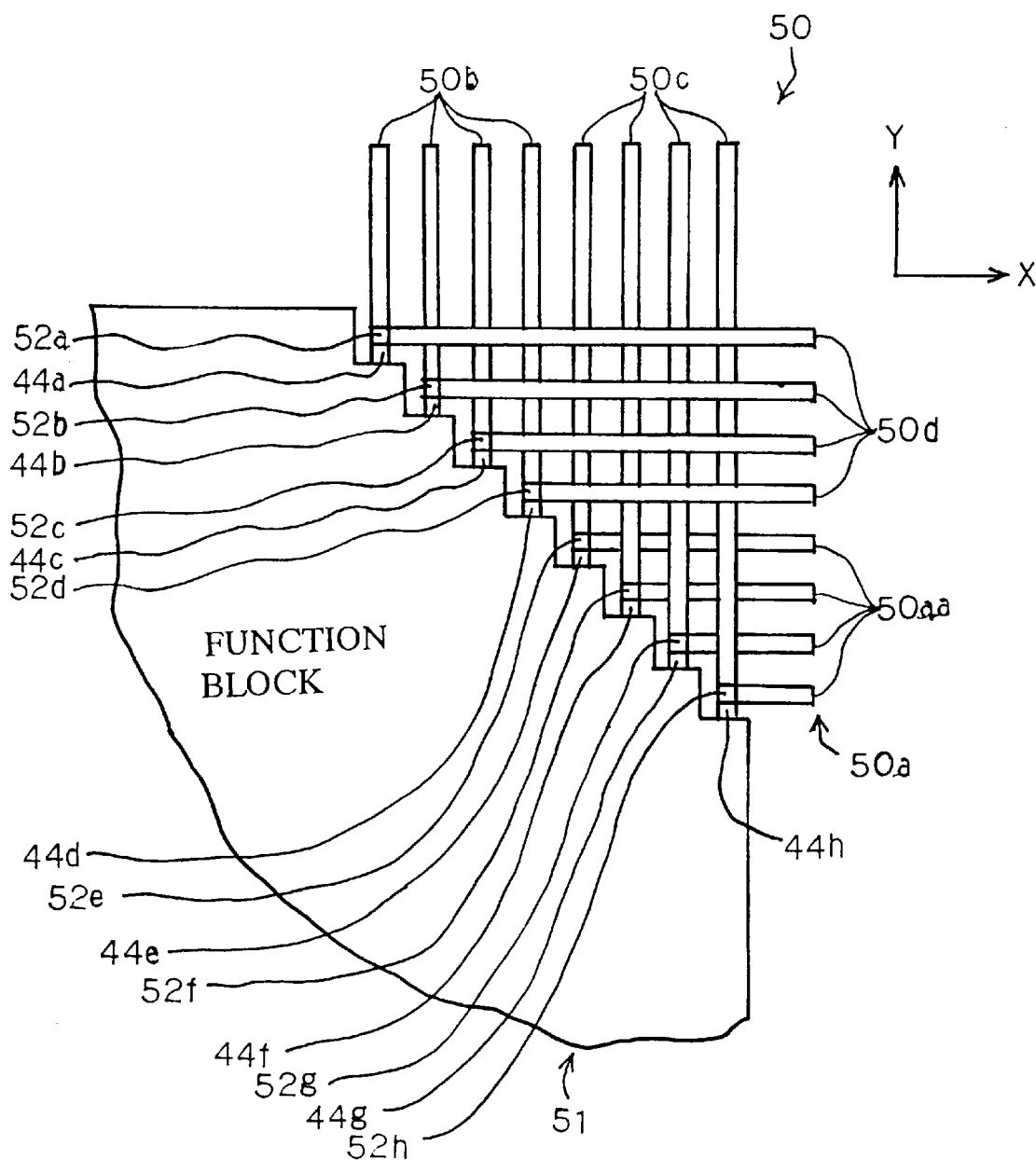
FIG. 6 is a plane view showing another semiconductor integrated circuit device according to the present invention.

FIG. 6 illustrates another semiconductor integrated circuit device embodying the present invention, and another wiring structure 50 is incorporated in the semiconductor integrated circuit device. A function block 51 is similar to the function block 41, and signal terminals are labeled with the same references as corresponding signal terminals of the function block 41 without detailed description. The signal terminals 44a to 44h are connectable through the wiring structure 50 to signal terminals of another function block (not shown).

The wiring structure 50 includes first-level conductive lines 50a, second-level conductive lines 50b/50c, third-level conductive lines 50d and vertical interconnections 52a to 52h. Although only the first-level conductive lines 50aa are seen in FIG. 6, the other first-level conductive lines 50a extend under the third-level conductive lines 50d, and, for this reason, are not seen in FIG. 6. The first-level conductive lines 50a and the third-level conductive lines 50d extend in the x-direction, and the second-level conductive lines 50b/50c extend in the y-direction. The wiring structure 50 is wrapped in a multilayered inter-level insulating structure (not shown), and the multi-layered inter-level insulating structure has a first-level insulating layer inserted between the signal terminals 44a to 44h and the first-level conductive lines 50a, a second-level insulating layer inserted between the first-level conductive lines 50a and the second-level conductive lines 50b/50c and a third inter-level insulating layer inserted between the second-level conductive lines 50b/50c and the third-level conductive lines 50d.

Through-holes (not shown) are formed in the multi-layered inter-level insulating structure, and the signal terminals 44a to 44h are exposed to the through-holes, respectively. The through-holes are filled with the vertical interconnections 52a to 52h, respectively.

The through-holes associated with the signal terminals 44a to 44d penetrate the first inter-level insulating layer, the first and second inter-level insulating layers or the first, second and third inter-level insulating layers, and the signal terminals 44a to 44d are connectable to the first-level conductive lines 50a, the second-level conductive lines 50b and/or the third-level conductive lines 50d. On the other hand, the through-holes associated with the signal terminals 44e to 44h penetrate the first inter-level insulating layer or the first and second inter-level insulating layers, and the signal terminals 44e to 44h are connectable to the first-level conductive lines 50a and/or the second-level conductive lines 50c. Thus, electric signals are propagated from the signal terminals 44a to 44h in the y-direction and/or the x-direction. The wiring structure implementing the second embodiment achieves all the advantages of the first embodiment.

Third Embodiment

Figure 7:
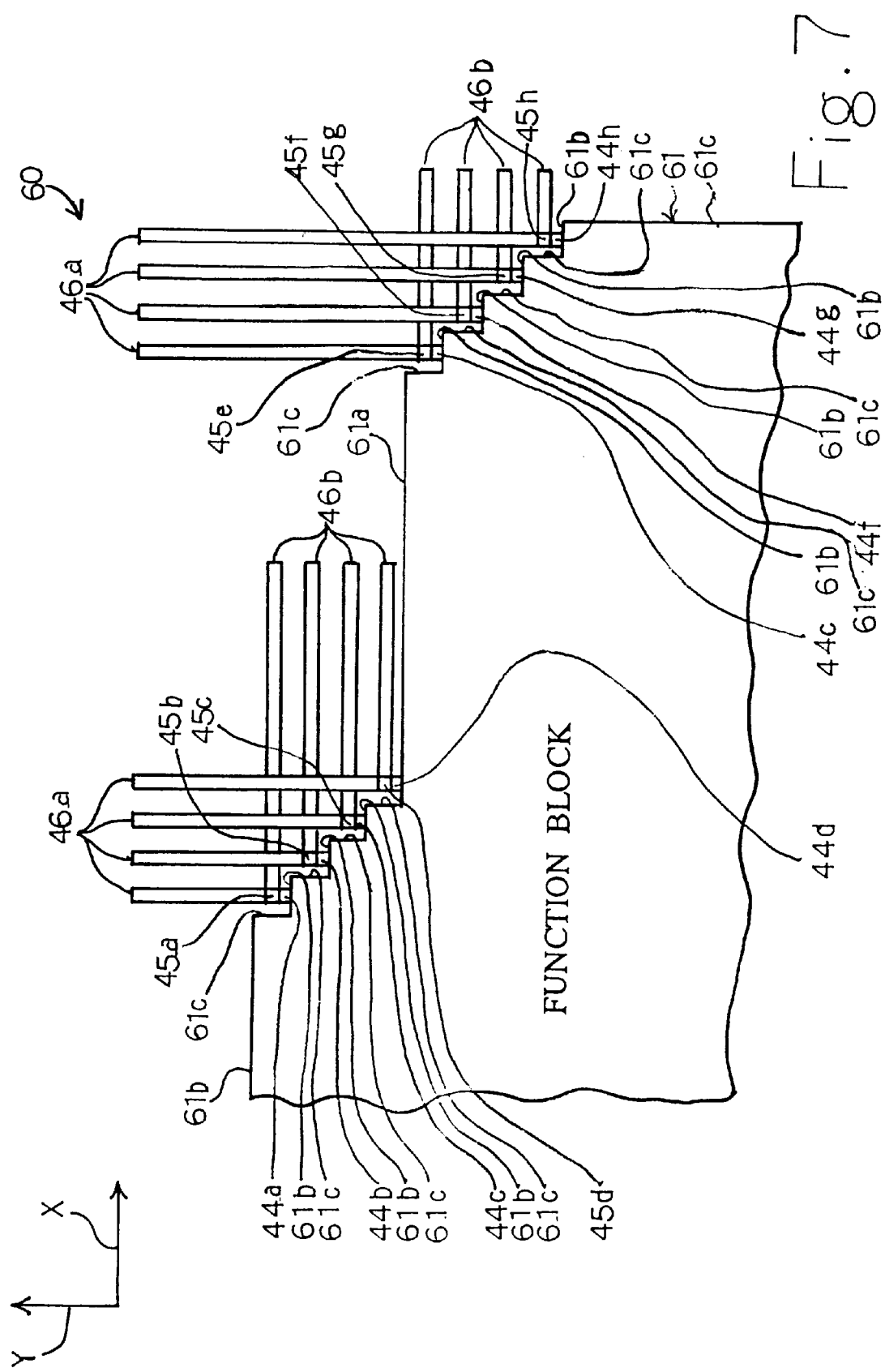
FIG. 7 is a plane view showing yet another semiconductor integrated circuit device according to the present invention.

FIG. 7 illustrates yet another semiconductor integrated circuit device embodying the present invention. The wiring structure 60 is similar to the wiring structure 43, and lines and interconnections are labeled with the same references designating corresponding parts of the first embodiment without detailed description. The wiring structure 60 is connected to a function block 61, and the function block 61 is similar to the function block 41 except for a second sub-line 61a forming a part of the zigzag line obliquely extending between an end line 61b and a side line 61c. Although other second sub-lines 61b are as short as the second sub-lines 41d, the second sub-line 61a is elongated, and the signal terminals 44a to 44d are spaced from the other signal terminals 44e to 44h. The first sub-lines 61c are as short as the first sub-lines 41c, and the first sub-lines 61c are alternately connected to the second sub-lines 61a/61b. The first sub-lines 61c and the second sub-lines 61a/61b form a zigzag line obliquely extending between the end line 61b and the side line 61c.

The wiring structure 60 achieves all the advantages of the first embodiment.

EXAMPLES

Using any one of the wiring structures 43, 50 and 60, function blocks are connected to one another as described hereinbelow.

Figure 8:
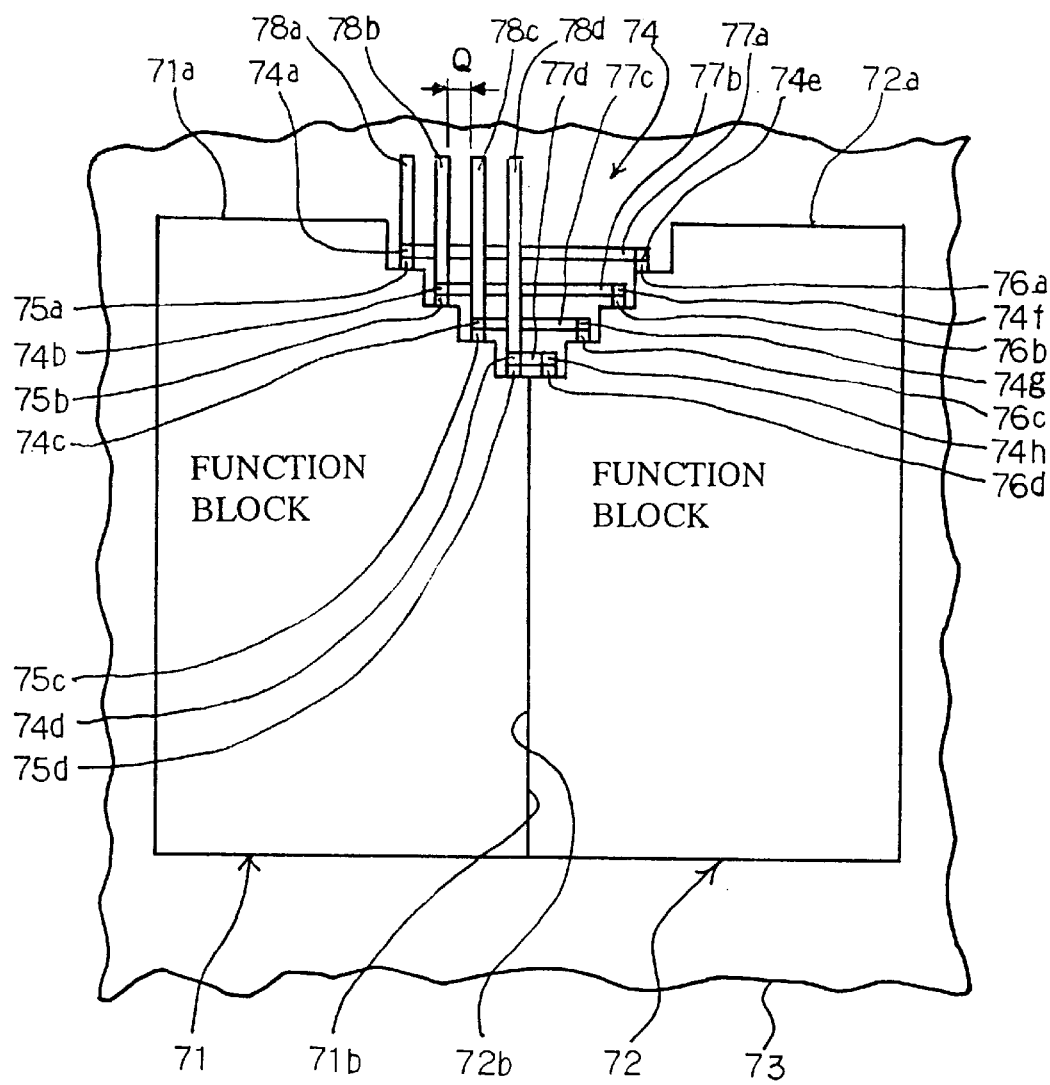
FIG. 8 is a plane view showing the wiring structure arranged between function blocks.

FIG. 8 illustrates the first example. Function blocks 71/72 are integrated on a semiconductor substrate 73 together with another function block (not shown), and the wiring structure 74 is analogous to the wiring structure 43 shown in FIG. 5. Signal terminals 75a, 75b, 75c and 75d are obliquely arranged between the end line 71a and the side line 71b, and signal terminals 76a, 76b, 76c and 76d are obliquely arranged between the end line 72a and the side line 72b.

The wiring structure includes vertical interconnections 74/74b/74c/74d/74e/74f/74g/74h, first-level conductive lines 77a/77b/77c/77d and second-level conductive lines 78a/789b/78c/78d. The signal terminals 75a/75b/75c/75d are connected through the vertical interconnections 74a/74b/74c/74d to both of the first-level conductive lines 77a/77b/77c/77d and the second-level conductive lines 78a/78b/78c/78d, respectively, and the signal terminals 76a/76b/76c/76d are connected through the vertical interconnections 74e/74f/74g/74h to the first-level conductive lines 77a/77b/77c/77d, respectively. Thus, the signal terminals 75a to 75d supply electric signals through the first-level conductive lines 77a to 77d to the signal terminals 76a to 76d and through the second-level conductive lines 78a to 78d to the signal terminals of another function block (not shown).

Figure 3:
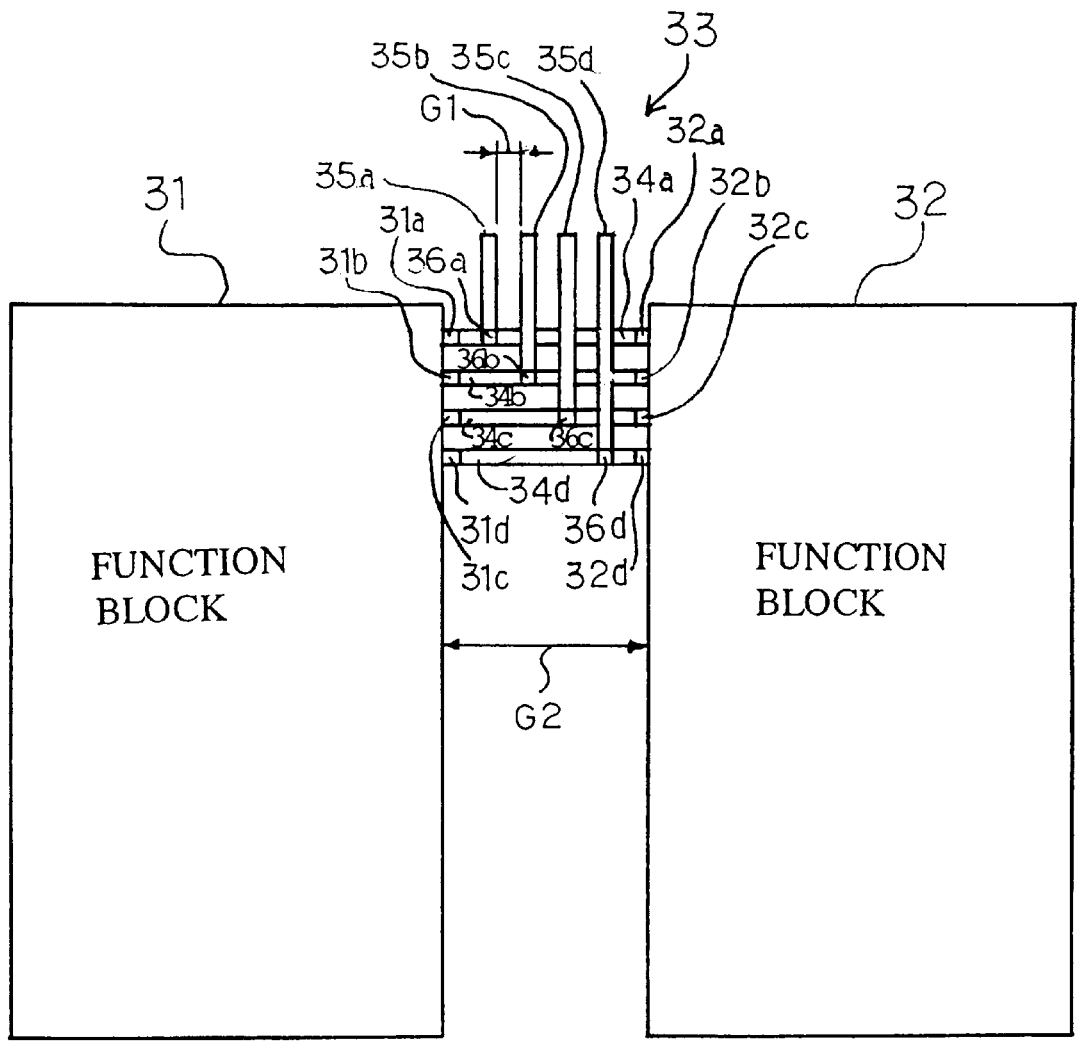
FIG. 3 is a plane view showing the third example of the prior art wiring structure.
Figure 4:
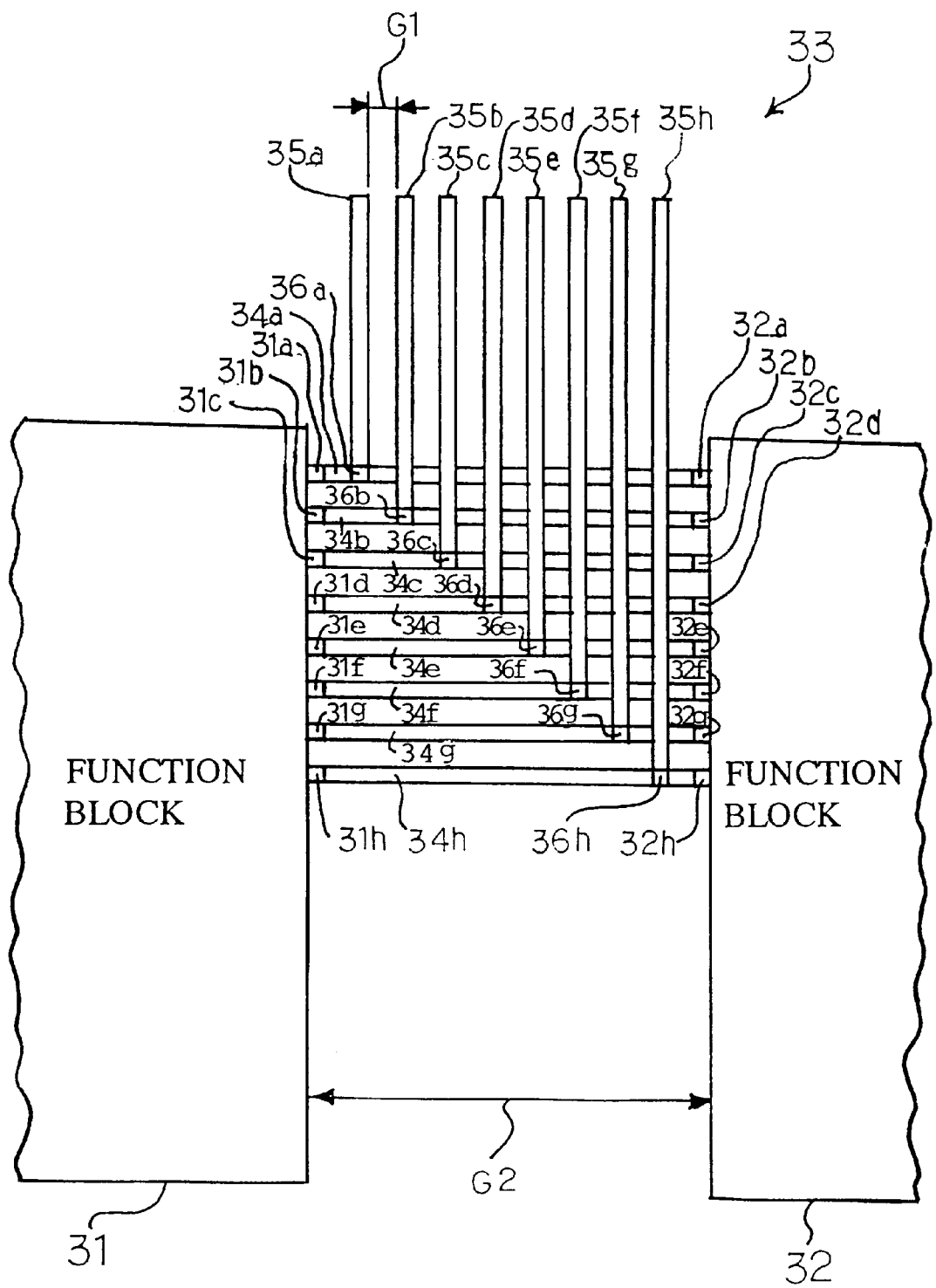
FIG. 4 is a plane view showing the prior art wiring structure having the signal terminals more than those of the third example.

The second-level conductive lines 78a to 78d are spaced from one another at intervals Q of 1 micron, and have width of 0.5 micron. The minimum gap between the signal terminal and the through-hole is 1 micron, and the minimum gap between the adjacent signal terminals is also 1 micron. Each of the signal terminals 75a to 75d/76a to 76d is 0.5 micron by 0.5 micron. The vertical interconnections 74a to 74d and the vertical interconnections 74e to 74h are arranged on the left side of the side line 71b and on the right side of the side line 72b, respectively, and any vertical interconnection is required between the vertical interconnections 74a to 74d and the vertical interconnections 74e to 74h. For this, reason, the wiring structure 74 does not require any space between the function blocks 71 and 72, and the function block 71 is contiguous to the function block 72. Comparing FIG. 8 with FIG. 3, it is understood that the wiring structure 74 according to the present invention is simple and requires area narrower than that of the prior art wiring structure.

Figure 9:
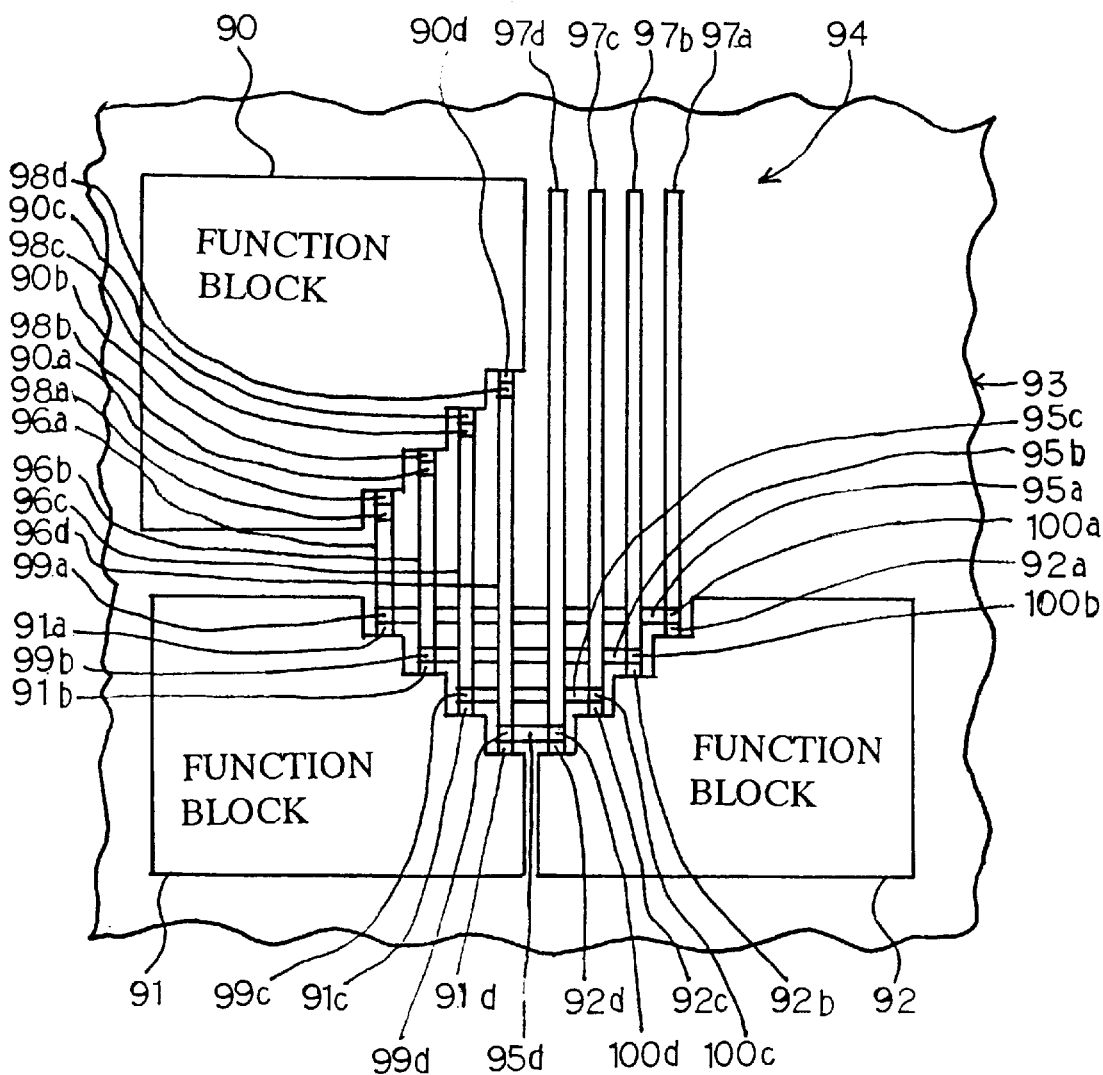
FIG. 9 is a plane view showing another wiring structure arranged between function blocks.

FIG. 9 illustrates the second example. Three function blocks 90, 91 and 92 are integrated on a single semiconductor substrate 93 together with other function blocks (not shown). A wiring structure 94 electrically connects the function blocks 90, 91 and 92 and another function block. The function blocks 90, 91 and 92 have signal terminals 90a/90b/90c/90d , 91a/91b/91c/91d and 92a/92b/92c/92d, respectively.

The wiring structure 94 is analogous to the wiring structure 43, and includes first-level conductive lines 95a/95b/95c/95d, second-level conductive lines 96a/96b/96c/96d and 97a/97b/97c/97d and vertical interconnections 98a/98b/98c/98d, 99a/99b/99c/99d and 110a/100b/100c/100d. The signal terminals 90a–90d are connected through the vertical interconnections 98a–98d, the second-level conductive lines 96a–96d and the vertical interconnections 99a–99d to the signal terminals 91–91d, which in turn are connected through the first-level conductive lines 95a–95d and the vertical interconnections 100a–100d to the signal terminals 92a–92d, which in turn are connected through the second-level conductive lines 97a–97d to signal terminals of another function block (not shown). Thus, the function block 90 supplies electric signal through the wiring structure 94 to the function blocks 91/92 and another function block.

Figure 1:
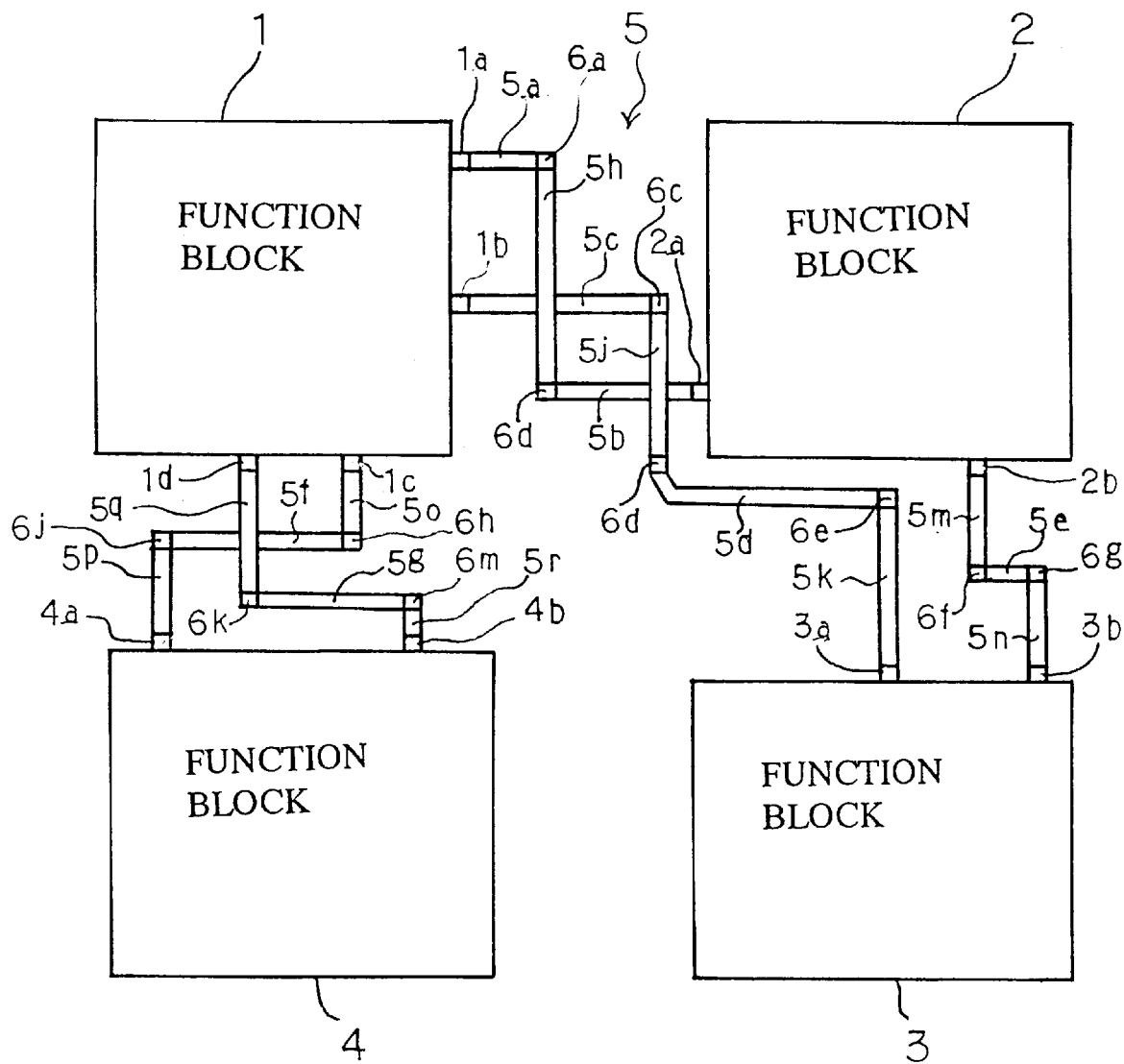
FIG. 1 is a plane view showing the prior art wiring structure disclosed in Japanese Patent Publication of Unexamined Application No. 62-120042.
Figure 2:
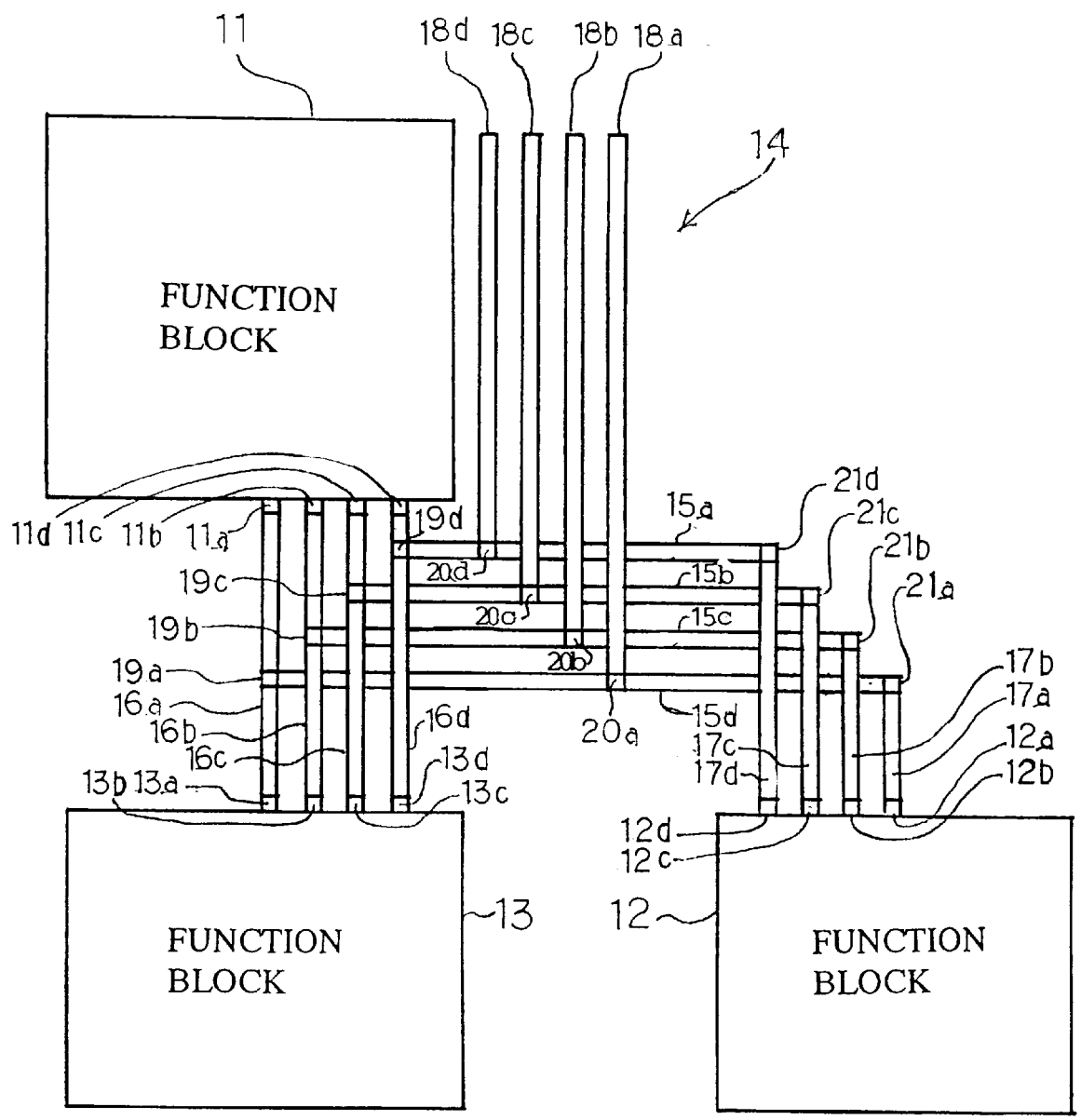
FIG. 2 is a plane view showing the second example of the prior art wiring structure.

Comparing FIG. 9 with FIG. 2, although the prior art wiring structure 14 requires six sets of vertical interconnections, the wiring structure 94 according to the present invention requires only three sets of vertical interconnections. Thus, the wiring structure according to the present invention is simpler than the prior art wiring structure 14, and makes the function blocks 90 to 92 closer to one another than those of the prior art.

The interconnections are selectively connected to the conductive lines on the different levels. Of course, a designer can not connect an interconnection to one of the conductive lines on the different levels. The wiring arrangement according to the present invention is appropriate for a semi-custom made integrated circuit such as, for example, ASICS.

As will be appreciated from the foregoing description, the wiring structure according to the present invention has the signal terminals obliquely arranged, and the signal terminals allow the vertical interconnections to connect the signal terminals to the conductive lines extending in perpendicular to one another without interference therebetween. Thus, the vertical interconnections makes the wiring structure simple, and allows a manufacturer to arrange the function clocks at high density.

Although particular embodiments of the present invention have been shown and described, it will be obvious to those skilled in the art that various changes and modifications may be made without departing from the spirit and scope of the present invention.

Each of the wiring structures 50/60 is available for the interconnections between function blocks as similar to the wiring structure 43.

The wiring structure may have more than three-layered conductive lines.

The first-level conductive lines extend at a certain angle with respect to the second-level conductive lines, and the certain angle may not be 90 degrees.

What is claimed is:

1. A semiconductor device comprising
    at least one function block producing electric signals and including a plurality of signal terminals having first signal terminals arranged along a first virtual line obliquely extending with respect to second virtual lines perpendicular to each other and used for electrical communication with at least one other function block, and
    a wiring structure connected to said first signal terminals for propagating said electric signals between said at least one function block and said at least one other function block and including
    first conductive lines arranged on a first level and obliquely extending with respect to said first virtual line,
    second conductive lines arranged on a second level different from said first level and extending at an angle with respect to said first virtual line and
    first interconnections selectively connecting said first signal terminals directly to said first and second said conductive lines.

2. The semiconductor device as set forth in claim 1, in which at least one of said first interconnections is connected to one of said second conductive lines.

3. The semiconductor device as set forth in claim 1, further comprising
    third conductive lines arranged on a third level different from said first level and said second level and extending in parallel to said first conductive lines, and
    second interconnections selectively connected between second signal terminals of said plurality of signal terminals and said first, second and third conductive lines.

4. The semiconductor device as set forth in claim 1, in which said second conductive lines extend at an angle with respect to said first conductive lines.

5. The semiconductor device as set forth in claim 4, in which said second conductive lines extend at an angle of approximately 90 degrees with respect to said first conductive lines.

6. The semiconductor device as set forth in claim 1, in which at least one of said first interconnections is connected to one of said first conductive lines.

7. The semiconductor device as set forth in claim 6, in which another of said first interconnections is connected to one of said first conductive lines and one of said second conductive lines.

8. The semiconductor device as set forth in claim 1, in which said first conductive lines extend in parallel to one of said second virtual lines, and said second conductive lines extend in parallel to the other of said second virtual lines.

9. The semiconductor device as set forth in claim 8, in which said at least one function block occupies a generally rectangular area having a pair of end lines parallel to said one of said second virtual lines and a pair of side lines parallel to said other of said second virtual lines, and said first virtual line extends between one of said end lines and one of said side lines.

10. The semiconductor device as set forth in claim 9, in which said first virtual line extends over a zigzag line consisting of a plurality of first sub-lines shorter than each side line and spaced from one another in a direction of said one of said second virtual lines and a plurality of second sub-lines shorter than each end line, spaced from one another in a direction of said other of said second virtual lines and alternately connected to said plurality of first sub-lines.

11. The semiconductor device as set forth in claim 10, in which one of said plurality of second sub-lines is longer than the others of said plurality of second sub-lines.

* * * * *